(12) United States Patent
Huang

(10) Patent No.: US 7,763,924 B2
(45) Date of Patent: Jul. 27, 2010

(54) DYNAMIC RANDOM ACCESS MEMORY STRUCTURE HAVING MERGED TRENCH AND STACK CAPACITORS

(75) Inventor: Wen-Kuei Huang, Hsinchu County (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 0 days.

(21) Appl. No.: 12/244,747

(22) Filed: Oct. 2, 2008

(65) Prior Publication Data

US 2010/0019301 A1    Jan. 28, 2010

(30) Foreign Application Priority Data

Jul. 22, 2008    (TW) ............................... 97127814 A

(51) Int. Cl.
   *H01L 27/108* (2006.01)
   *H01L 29/94* (2006.01)
(52) U.S. Cl. .................. 257/303; 257/301; 257/302; 257/306; 257/309; 257/311; 257/330; 257/331; 257/332; 257/906; 257/908
(58) Field of Classification Search ............ 257/301, 257/302, 303
   See application file for complete search history.

(56) References Cited

U.S. PATENT DOCUMENTS

| | | | |
|---|---|---|---|
| 5,909,619 A | 6/1999 | Chi | |
| 5,920,785 A | 7/1999 | Chi et al. | |
| 6,018,177 A | 1/2000 | Chi | |
| 6,406,971 B1 * | 6/2002 | Chien et al. | 438/398 |
| 2001/0046737 A1 * | 11/2001 | Ahn et al. | 438/253 |
| 2005/0280001 A1 * | 12/2005 | Chang | 257/68 |
| 2006/0076602 A1 * | 4/2006 | Harter et al. | 257/301 |
| 2006/0208298 A1 * | 9/2006 | Chang et al. | 257/301 |
| 2006/0284225 A1 * | 12/2006 | Popp et al. | 257/296 |

* cited by examiner

*Primary Examiner*—N Drew Richards
*Assistant Examiner*—Michael Jung
(74) *Attorney, Agent, or Firm*—Winston Hsu

(57) ABSTRACT

A dynamic random access memory structure includes a recessed-gate transistor disposed in the substrate; a trench capacitor structure disposed in the substrate and electrically connected to a first source/drain of the recessed-gate transistor; a first conductive structure disposed on and contacting the trench capacitor structure; a stack capacitor structure disposed on and contacting the first conductive structure, wherein a bottom electrode of the trench capacitor structure and a top electrode of the stack capacitor structure are electrically connected to serve as a common electrode; and a bit line disposed above a second source/drain of the recessed-gate transistor and electrically connected to the second source/drain, wherein the top of the bit line is lower than the top of the gate conductive layer of the recessed-gate transistor.

9 Claims, 10 Drawing Sheets

DYNAMIC RANDOM ACCESS MEMORY STRUCTURE HAVING MERGED TRENCH AND STACK CAPACITORS

BACKGROUND OF THE INVENTION

1. Field of the Invention

The present invention relates to a dynamic random access memory (DRAM) structure, and particularly to a DRAM structure having a merged trench and stack capacitor.

2. Description of the Prior Art

Along with the development of miniaturization of various electronic products, the design of the dynamic random access memory (DRAM) elements has to match the requirement of high integration and high density. DRAMs with trench capacitors have become one of the main structures of high-integrated DRAM products. Such DRAMs contain trench capacitors fabricated inside deep trenches that are formed in a semiconductor substrate by an etching process so as to well utilize space of chips to effectively reduce memory cell size. However, trench-type DRAMs, as well as stack-type DRAMs, have encountered the feature size limitation, and it is difficult to increase capacitance of the capacitor of the memory cell laid out within the limited size.

U.S. Pat. No. 5,920,785 discloses a twin bit DRAM cell capable of storing two bits of digital data as stored charge within the DRAM cell, which has two pass transistors, a trench capacitor structure, and a stack capacitor structure. The pass transistors each have a source connected to a bit line voltage generator to control placement of the charge within the twin bit DRAM cell, a gate connected to a word line voltage generator to control activation of the DRAM cells, and a drain. In such way, the trench capacitor structure and the stack capacitor structure are each an individual capacitor and independently employed, and, accordingly, the maximal capacitance exhibited is only the capacity of the respective capacitors.

U.S. Pat. No. 6,018,177 discloses a DRAM cell capable of storing two bits of digital data as four levels of stored charge within the DRAM cell. The four level DRAM cell has a pass transistor, a trench capacitor structure, and a stack capacitor structure. The pass transistors has a source connected to a bit line voltage generator to control placement of the charge within the four level DRAM cell, a gate connected to a word line voltage generator to control activation of the DRAM cells, and a drain. The trench capacitor structure has a top plate connected to the drain and a bottom plate connected to a substrate biasing voltage source. The stack capacitor structure has a first plate connected to the drain and a second plate connected to a coupling-gate voltage generator. The coupling-gate voltage generator will provide four levels of voltage that will indicate the level of charge to be stored within the four level DRAM cell. An interconnecting block will interconnect the top plate of the trench capacitor structure to the first plate of the stack capacitor structure. The interconnection point between the trench capacitor structure and the stack capacitor structure will form the storage node that will retain the level of charge to indicate the state of the two bits of digital data. In such way, the trench capacitor structure has an electrode connecting to the substrate biasing voltage source, and the stack capacitor structure has an electrode connecting to the coupling-gate voltage generator. Accordingly, the two capacitors are each an individual capacitor and independently employed, and the maximal capacitance obtained is only the capacity of the respective capacitors, not the sum.

Therefore, there is still a need for a novel DRAM structure having an increased capacitance within the feature size limitation to match the demand of high integration and high density.

SUMMARY OF THE INVENTION

One objective of the present invention is to provide a DRAM structure having a capacitor including a stack and a trench capacitor structure, which has an increased capacitance under the limitation of feature size.

The DRAM structure according to the present invention includes a substrate; a recessed-gate transistor disposed in the substrate, the recessed-gate transistor having a gate conductor layer, a first source/drain, and a second source/drain, the gate conductor layer extending from within the substrate to above the substrate; a trench capacitor structure disposed in the substrate and electrically connected to the first source/drain through a single-sided buried strap (SSBS); a first conductive structure disposed on the trench capacitor structure to contact the trench capacitor structure; a stack capacitor structure disposed on the first conductive structure to contact the first conductive structure, wherein a bottom electrode of the trench capacitor structure and a top electrode of the stack capacitor structure are electrically connected to each other to serve as a common electrode; and a bit line disposed above a second source/drain of the recessed-gate transistor and electrically connected to the second source/drain, and the top of the bit line is lower than the top of the gate conductor layer.

These and other objectives of the present invention will no doubt become obvious to those of ordinary skill in the art after reading the following detailed description of the preferred embodiment that is illustrated in the various figures and drawings.

DETAILED DESCRIPTION

The DRAM structure according to the present invention has features of, for example, a recessed-gate transistor whose gate is directly stitched with a word line; a capacitor including a trench capacitor structure disposed in the substrate and a stack capacitor structure disposed above the substrate and electrically connected to the trench capacitor structure via a conductive structure; and a word line higher than a bit line (i.e. word line-over-bit line, WOB). The capacitor is electrically connected, from an electrode of the trench capacitor structure, to a source/drain of the transistor through an SSBS. The bottom electrode of the trench capacitor structure and the top electrode of the stack capacitor structure are electrically connected to each other to serve as a common electrode, i.e. another electrode of the capacitor. With such structure, the total capacitance is achieved as the sum of the respective capacitor structures, and thus the goal to increase capacitance can be attained under the feature size limitation.

The conductive plug connecting the trench capacitor structure and the stack capacitor structure in the capacitor structure of the present invention can be made sufficiently in the space between two adjacent bit lines. Accordingly, the DRAM structure according to the present invention can be easily arranged to form a so-called checkerboard array.

Furthermore, a metal interconnect, which is electrically connected to the word line (also referred as the gate conductor layer) of the DRAM structure according to the present invention through a conductive plug, can be disposed at either of two different levels (heights) with respect to the stack capacitor structure of the capacitor: at one level, the location of the stack capacitor structure of the capacitor can be higher than the location of the metal interconnect; at the other level, the location of the metal interconnect can be right above the stack capacitor structure of the capacitor.

Figure 1:
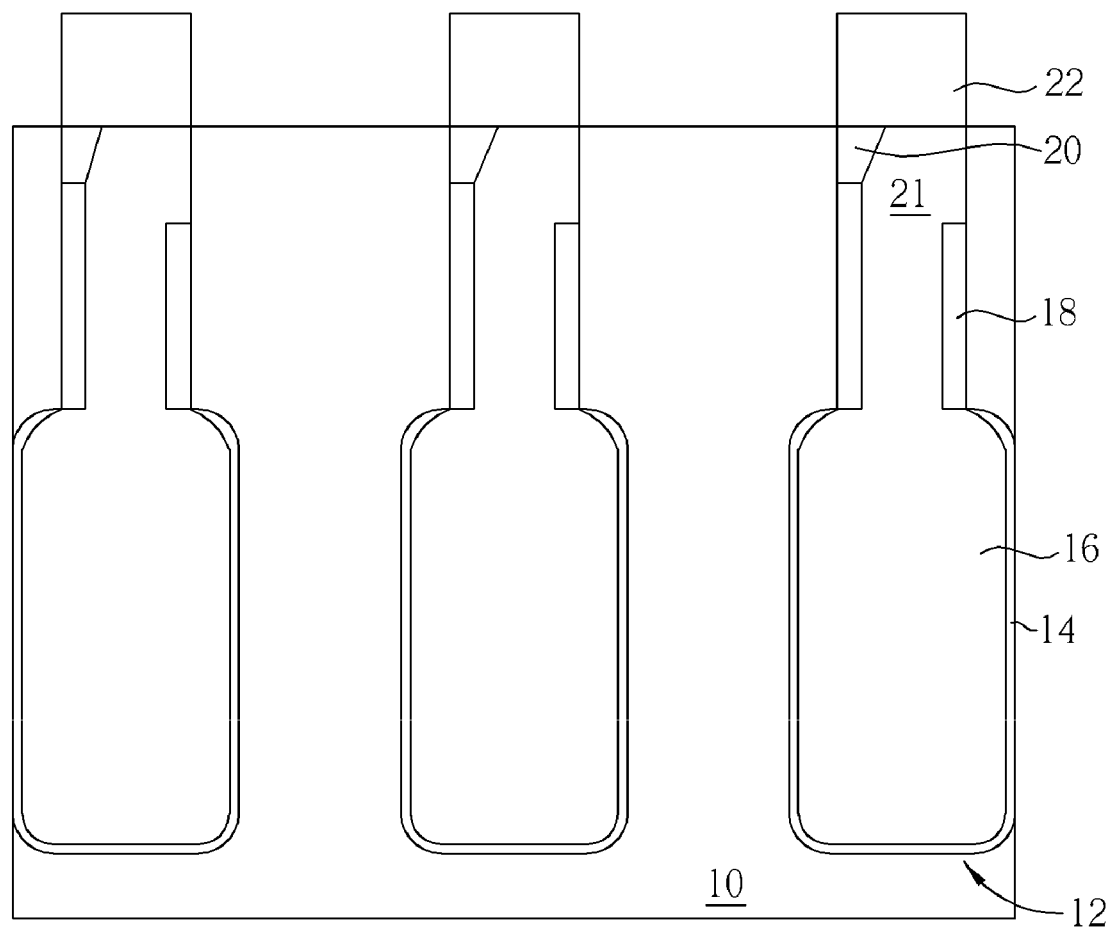
FIGS. 1-5 are schematic cross-section views showing an embodiment of making the DRAM structure according to the present invention.

The DRAM structure according to the present invention can be made as illustrated by the following embodiment. The DRAM structure is suitable for a checkerboard array configuration. Please refer to FIGS. 1 to 5 and take FIG. 6 with reference respectively. As shown in FIG. 1, first, a substrate 10, such as semiconductor substrate, is provided. Next, a plurality of trench capacitor structures 12 are formed in the substrate 10 to serve as the trench capacitor structures of the capacitors of the present invention. The trench capacitor structures are not particularly limited to any type and can be conventional ones. Each trench capacitor structure 12 so shown in the drawings is only an example and should never be construed as limitations to the structure of the present invention. The trench capacitor structure 12 includes a capacitor dielectric layer 14, a conductive layer 16, an oxide layer 18, a shallow trench isolation 20, and an SSBS 21. The conductive layer 16 serves as a top electrode of the trench capacitor structure 12. The substrate in the proximity of the capacitor dielectric layer 14 serves as the bottom electrode plate (the buried plate) of the trench capacitor structure 12. The trench capacitor structure 12 can be made using conventional techniques, and accordingly the detailed processes are not described. In addition, a trench cap layer 22 including such as tetraethylorthosilicate (TEOS) oxide layer is formed on each trench capacitor structure 12 by deposition and etching processes.

Figure 2:
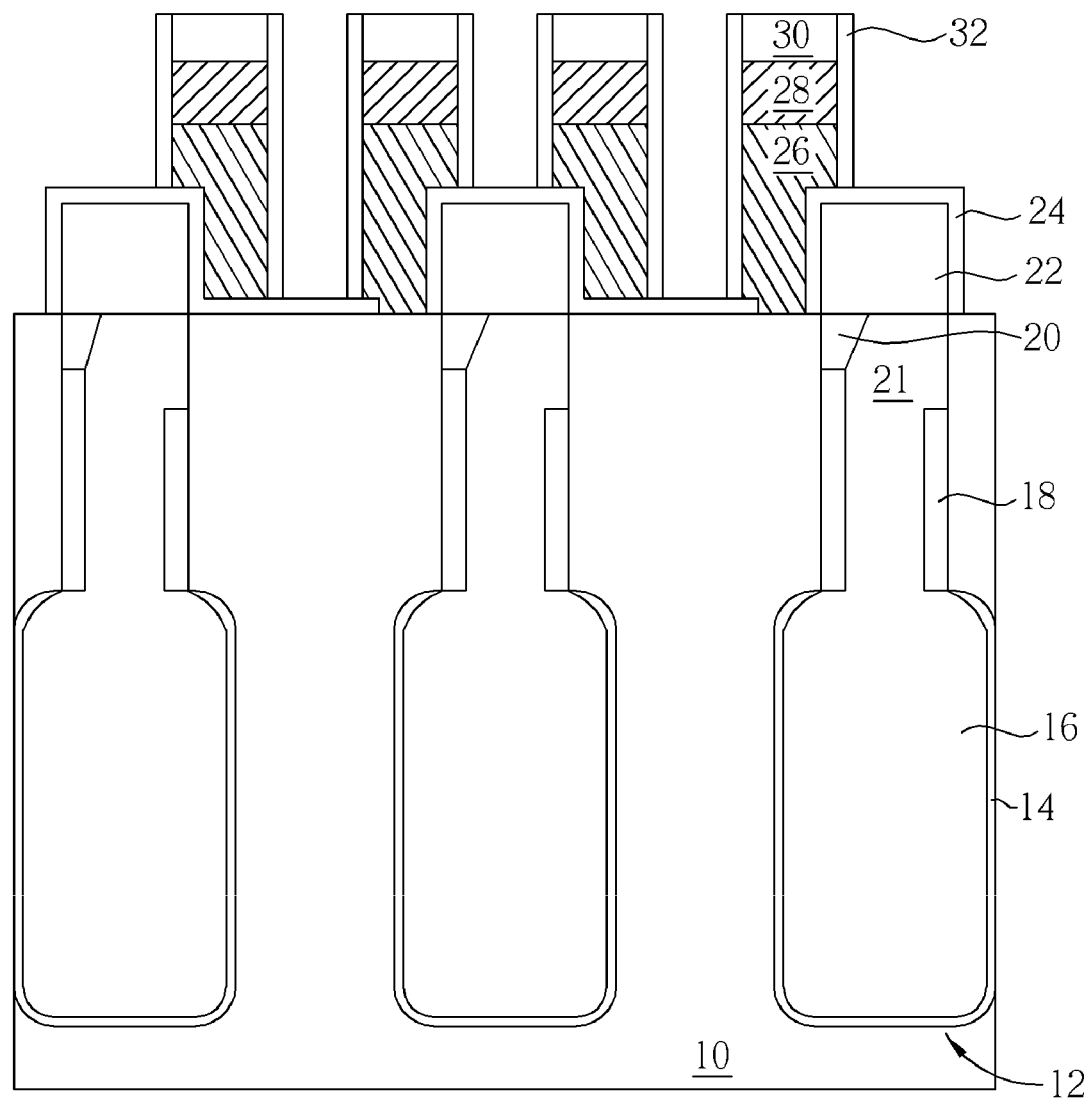

Thereafter, referring to FIG. 2, an insulation layer 24, such as TEOS oxide layer, is formed in a blanket form to cover the substrate 10 and the trench cap layers 22. Thereafter, the insulation layer 24 is partially etched to have openings exposing the substrate 10 adjacent to the trench cap layers 22, for the contact of the bit lines later on. Thereafter, a polysilicon layer 26 is formed, using, for example, a low pressure chemical vapor deposition (LPCVD) process, on the insulation layer 24 and filled the openings to contact the substrate 10 and thereafter defined for serving as bit line contacts. Then, a tungsten metal layer is formed on the polysilicon layer 26 using for example an LPCVD process. Then, a cap layer 30, for example a silicon nitride layer, is formed to cover the tungsten metal layer. Lithography and etching processes are performed on the cap layer 30 and the tungsten metal layer to form bit lines 28 (also referring to FIG. 6). As the formation of the bit lines is well known in the art, detailed description as such will not be provided for concise and brevity. A protection layer 32, such as silicon nitride layer or silicon nitride-silicon oxide-silicon nitride layer, may be further formed on the wall of the bit lines.

Figure 3:
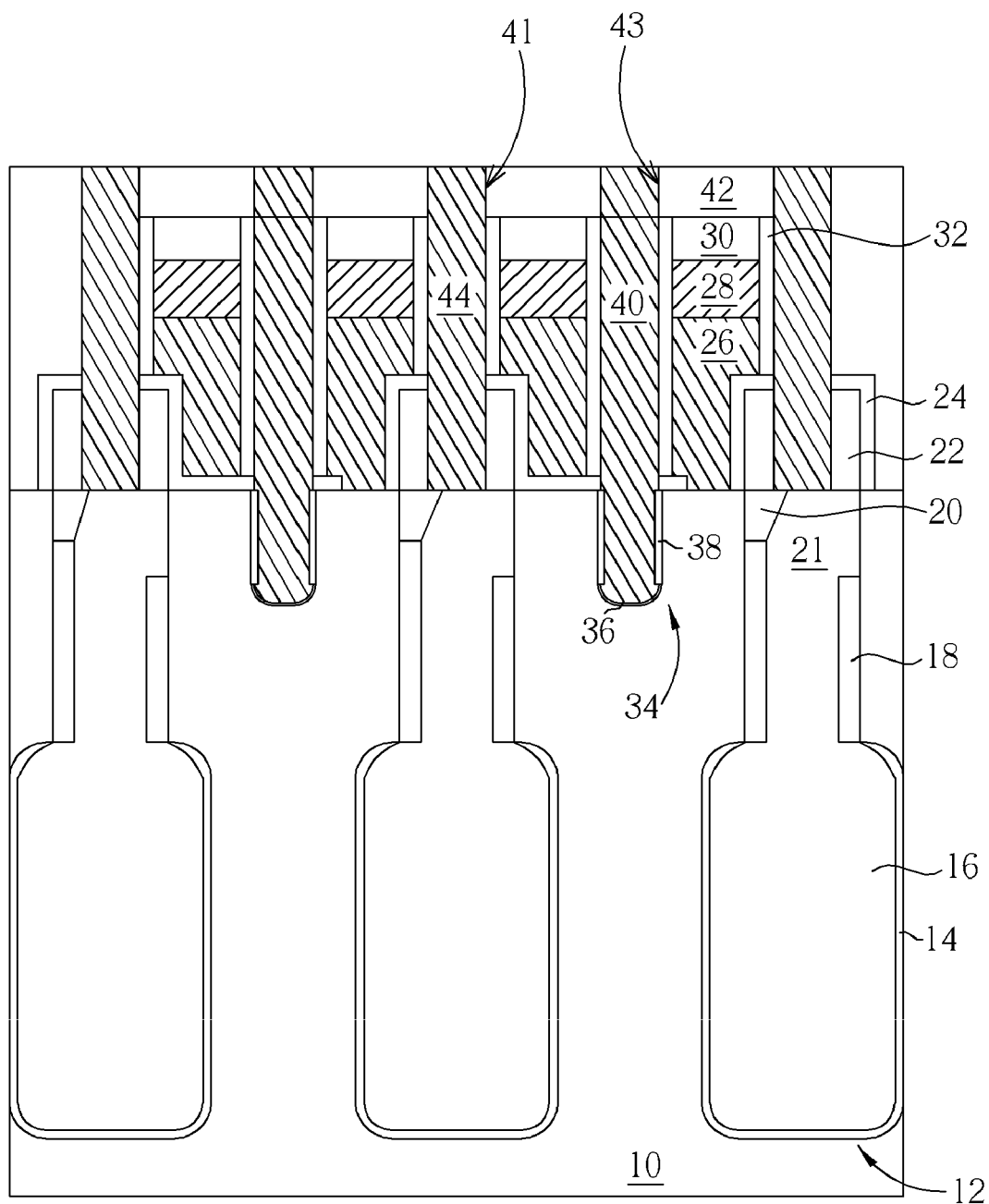

Thereafter, referring to FIG. 3, a photo resist layer is formed and patterned on the cap layer 30 to have openings for etching the substrate 10 between two bit lines. A plurality of gate trenches are accordingly formed by etching through the openings, and then recessed-gate transistors 34 are formed therein. The recessed-gate transistor 34 includes a gate oxide layer 36, a sidewall dielectric 38, and a gate conductor layer 40, as well as a recessed gate channel 39 (please refer to FIG. 6). The source/drain doped regions may be formed previously by thermal diffusion during the formation of the SSBS of the trench capacitor structures. The gate conductor layer 40 extends upwardly or vertically from within the gate trenches in the substrate to a position above the substrate between two bit lines so as to fill the space between the two bit lines. The recessed-gate transistor 34 may be a conventional structure made by conventional techniques. Accordingly, the detailed processes are not described for purpose of concise. Thereafter, the photo resist layer is removed, and a dielectric layer 42, such as TEOS oxide layer, is formed all over the substrate, and planarized. Thereafter, recesses 41 are formed by lithography and etching processes to etch through the trench cap layer 22, insulation layer 24, and dielectric layer 42 above the trench capacitor structures 12. Trenches 43 are further formed in the dielectric layer 42 on the top of the gate conductor layers 40. Thereafter, a conductive layer, such as a polysilicon or metal layer, is formed to fill the recesses 41 and the trenches 43 and planarized by removal of excessive conductive layer, to form conductive plugs 44 in the recesses 41 to connect to the trench capacitor structures 12, and to form a conductive layer in the trenches 43 to be integrated with the gate conductor layers 40. The conductive plug 44 is also referred to as contact node. As shown in FIG. 3, the conductive plug 44 linearly penetrates the insulation situated directly above the trench capacitor structure 12.

Figure 4:
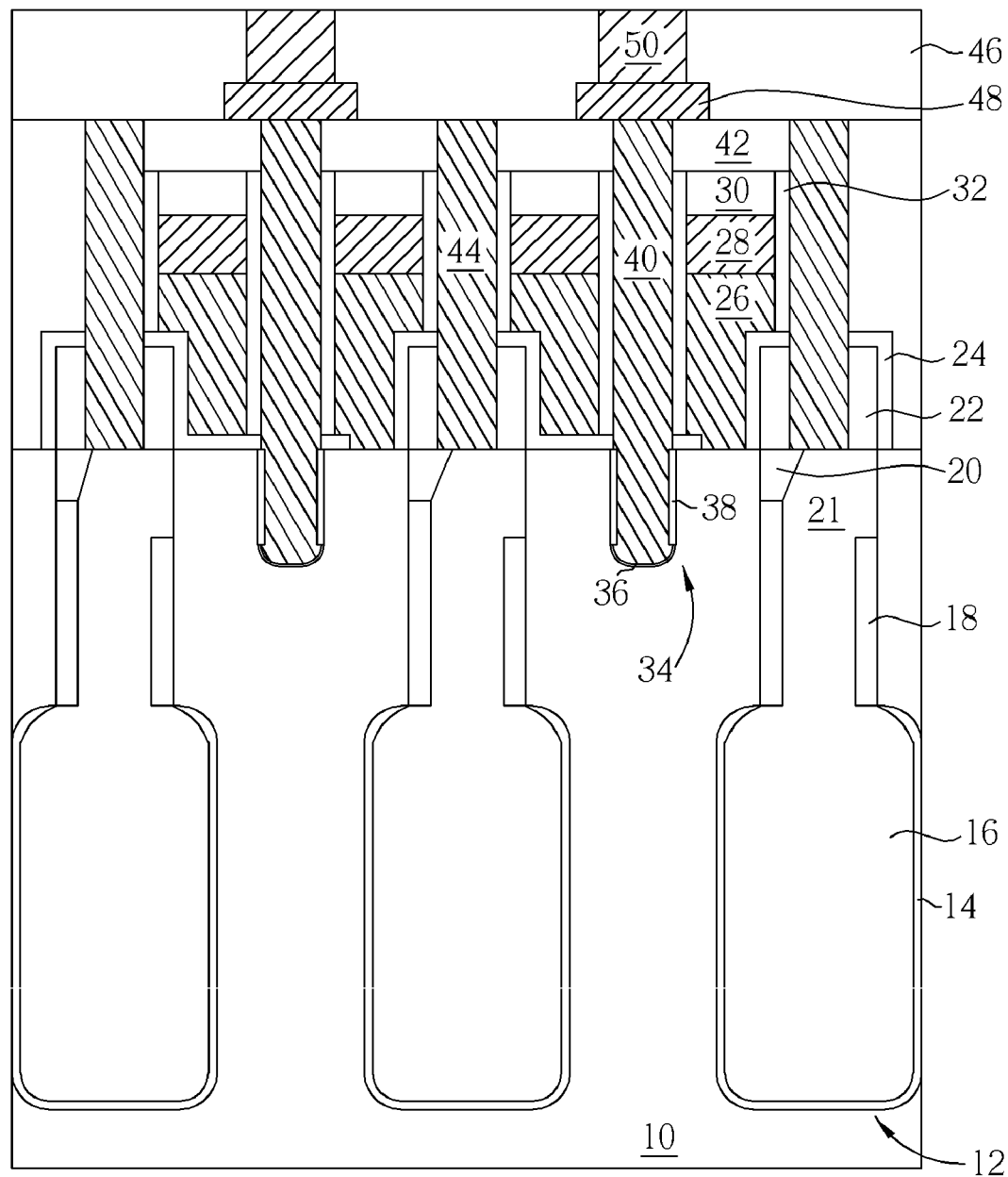
Figure 6:
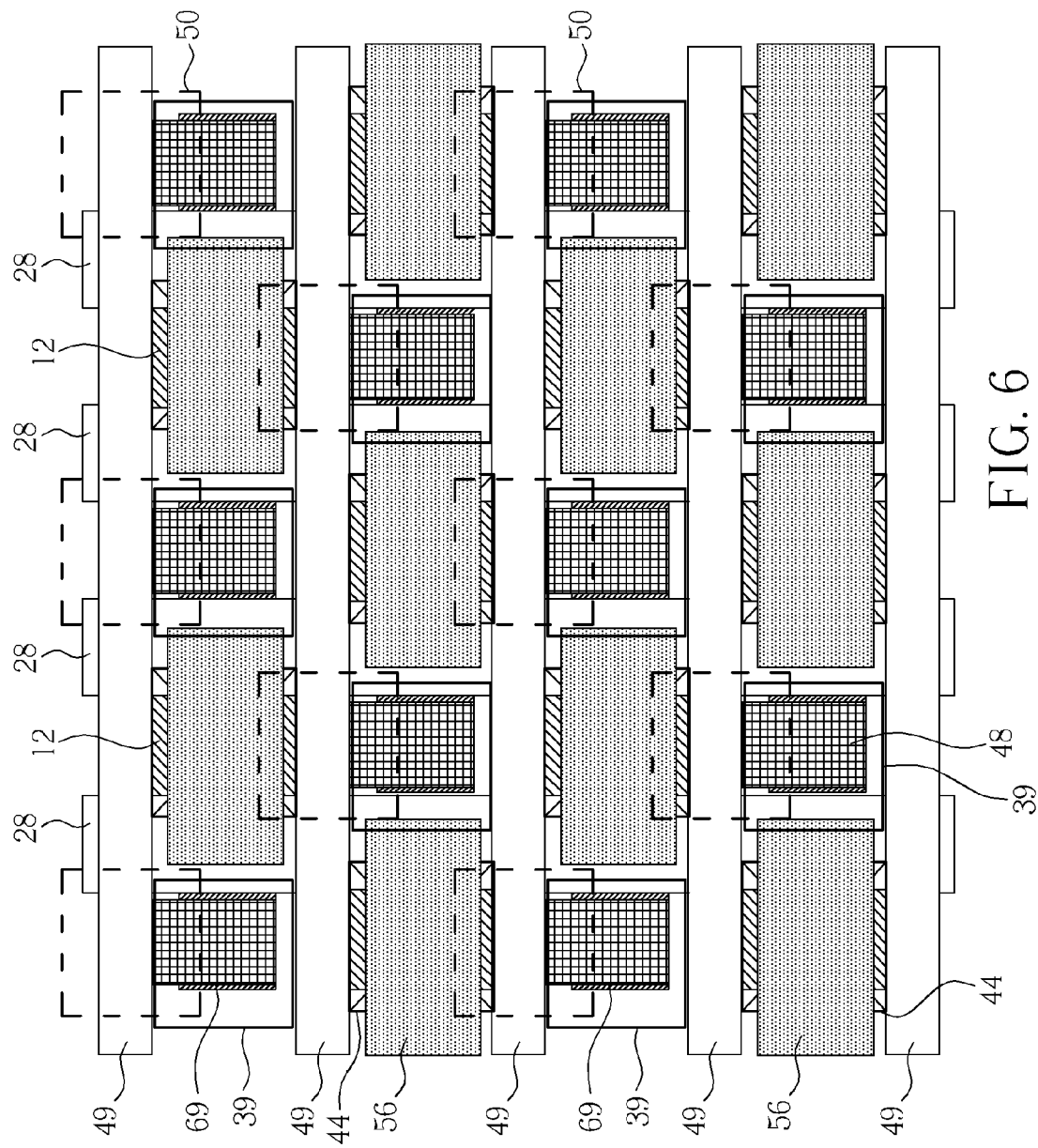
FIG. 6 is a layout diagram showing part of an array of the DRAM structures according to the present invention.
Figure 7:
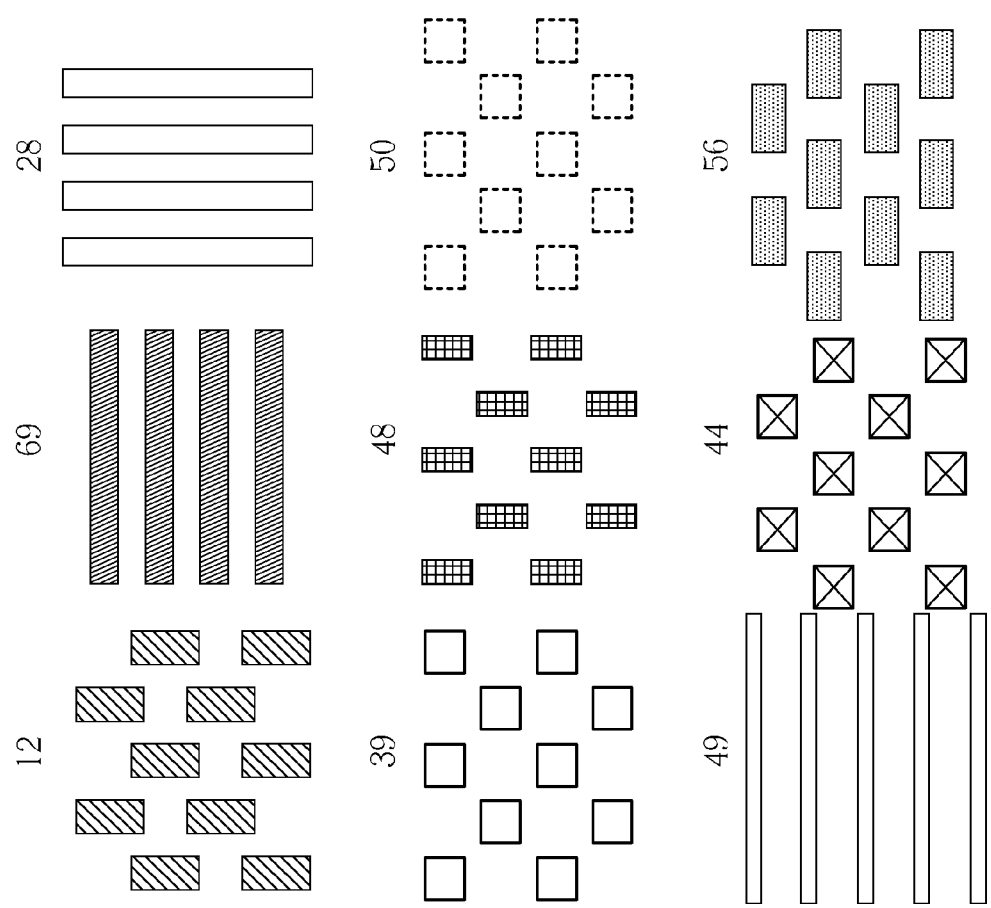
FIG. 7 is a schematic diagram showing the respective layouts of the components in FIG. 6.

Thereafter, referring to FIG. 4, landing pads 48 are formed on the gate conductor layers 40 for the connection of the gate conductor layers 40 with metal interconnects (such as the first metal interconnects 49 shown in FIG. 6). For allowing the metal interconnect to substantially perpendicularly intersect the gate conductor layer, the landing pad 48 extends in a direction substantially parallel to the bit line 28 at a distance enough for the metal interconnect to be located thereon. In such way, a space is yielded for forming a conductive structure merging the trench capacitor structure and the stack capacitor structure of the capacitor. That is, the location of the landing pads 48 is higher than that of the bit lines 28 and lower than that of the stack capacitor structures to be made later, such that the location of the first metal interconnects 49 is higher than the bit lines 28 and lower than the stack capacitor structures. Accordingly, with such arrangement, the first metal interconnect 49 and the conductive structure will not present on a same vertical cross section of the DRAM structure taken along a longitudinal direction of the first metal interconnect. In other words, the first metal interconnect 49 and the conductive structure are located on substantially different cross sections and do not vertically directly of indirectly overlap with each other, and this is clearly shown in FIG. 6. The landing pads 48 or the metal interconnects may be formed within an interlayer dielectric 46 previously formed on the gate conductor layer 40 and the dielectric layer 42 by conventional damascene or metal etching processes. The detailed processes thereof are not described for purpose of concise. It is optional to further form plugs 50 to strengthen the structure of the landing pads 48 and the metal interconnects.

Figure 5:
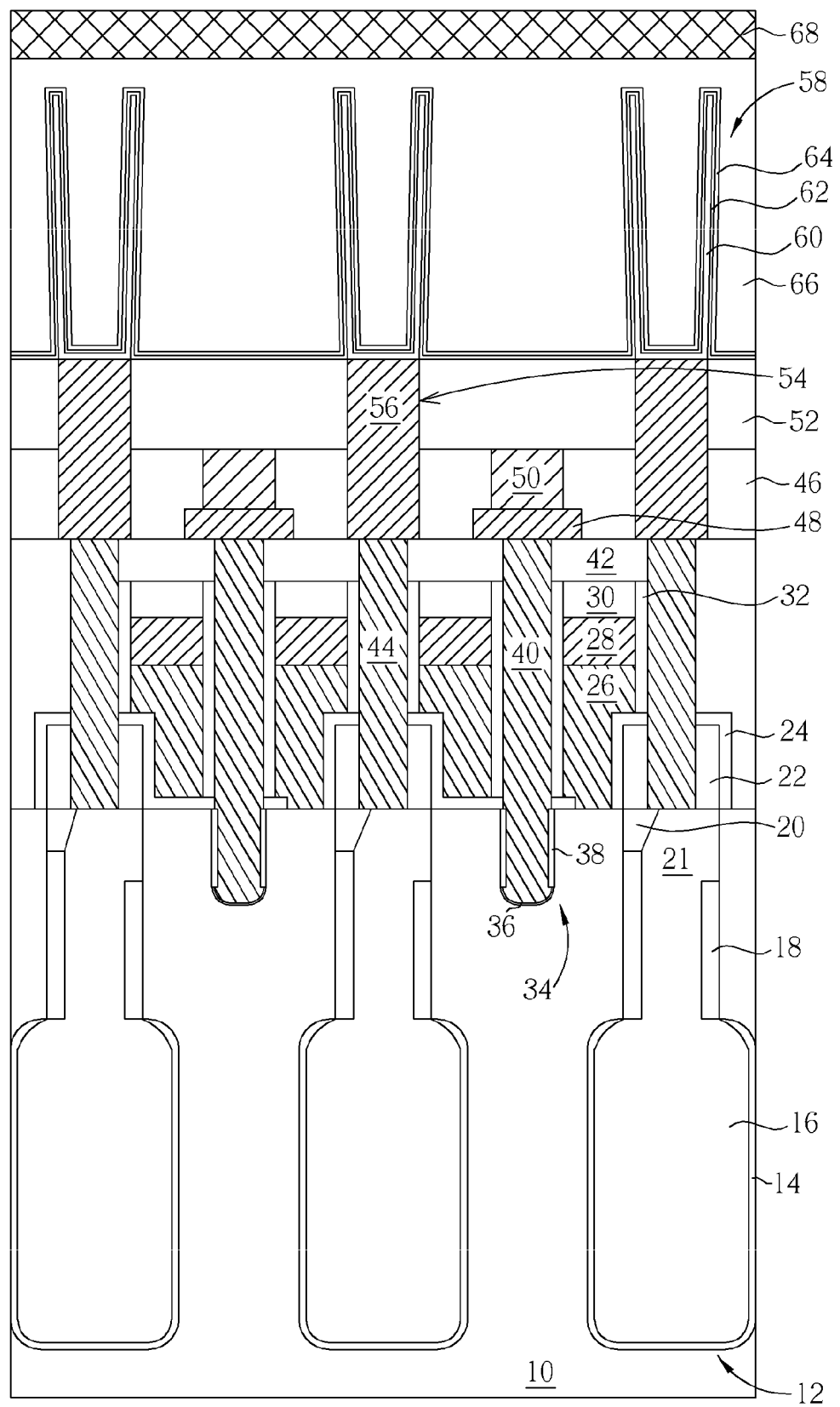

Thereafter, referring to FIG. 5, conductive plugs 56 are formed by for example damascene processes. For example, an interlayer dielectric 52, such as TEOS oxide layer, is formed, and then recesses 54 are formed in the interlayer dielectric 52 and 46 to expose the conductive plugs 44. A conductive material, such as tungsten, is filled in the recesses 54 and planarized by a CMP process to form conductive plugs 56. Accordingly, each conductive plug 56 joins each conductive plug 44 to form a conductive structure. The conductive plug 56 may serve as a storage node. Thereafter, a stack capacitor structure 58 is formed on each conductive plug 56. In this embodiment, the stack capacitor structure 58 is formed in an interlayer dielectric 66 and includes a conductive layer 60 serving as a bottom electrode plate, a dielectric layer 62, and a conductive layer 64 serving as a top electrode plate. The conductive layer 60 contacts the conductive plugs 56. The top electrode plate 64 of the stack capacitor structure 58 is electrically connected to the bottom electrode plate of the trench capacitor structure 12 (i.e. the substrate 10 in the proximity of the capacitor dielectric 14) in, for example, periphery regions outside the DRAM array region (but not limited thereto), through conductive plugs and metal interconnects, and both the top electrode plate of the stack capacitor structure and the bottom electrode plate of the trench capacitor structure have the same electric potential, for example, the grounding potential. Accordingly, the trench capacitor structure 12 and the stack capacitor structure 58 merge together to form a capacitor through conductive structures (i.e. conductive plugs 44 and 56). The total capacitance thus obtained is much increased in comparison with a conventional capacitor. The stack capacitor structure 58 may have a conventional structure and is not particularly limited. The stack capacitor structure 58 may be formed by conventional techniques and accordingly the detailed processes are not described for purpose of concise.

In this embodiment, the location of the stack capacitor structures 58 is higher than that of the first metal interconnects (metal 1). From a top view of the DRAM structure, the first metal interconnects 49 are disposed between two adjacent active areas 69 and do not overlap the active areas 69.

Metal interconnects 68, such as the second metal interconnects (metal 2), may be further formed on the interconnect dielectric 66, that is, above the stack capacitor structures 58.

Figure 8:
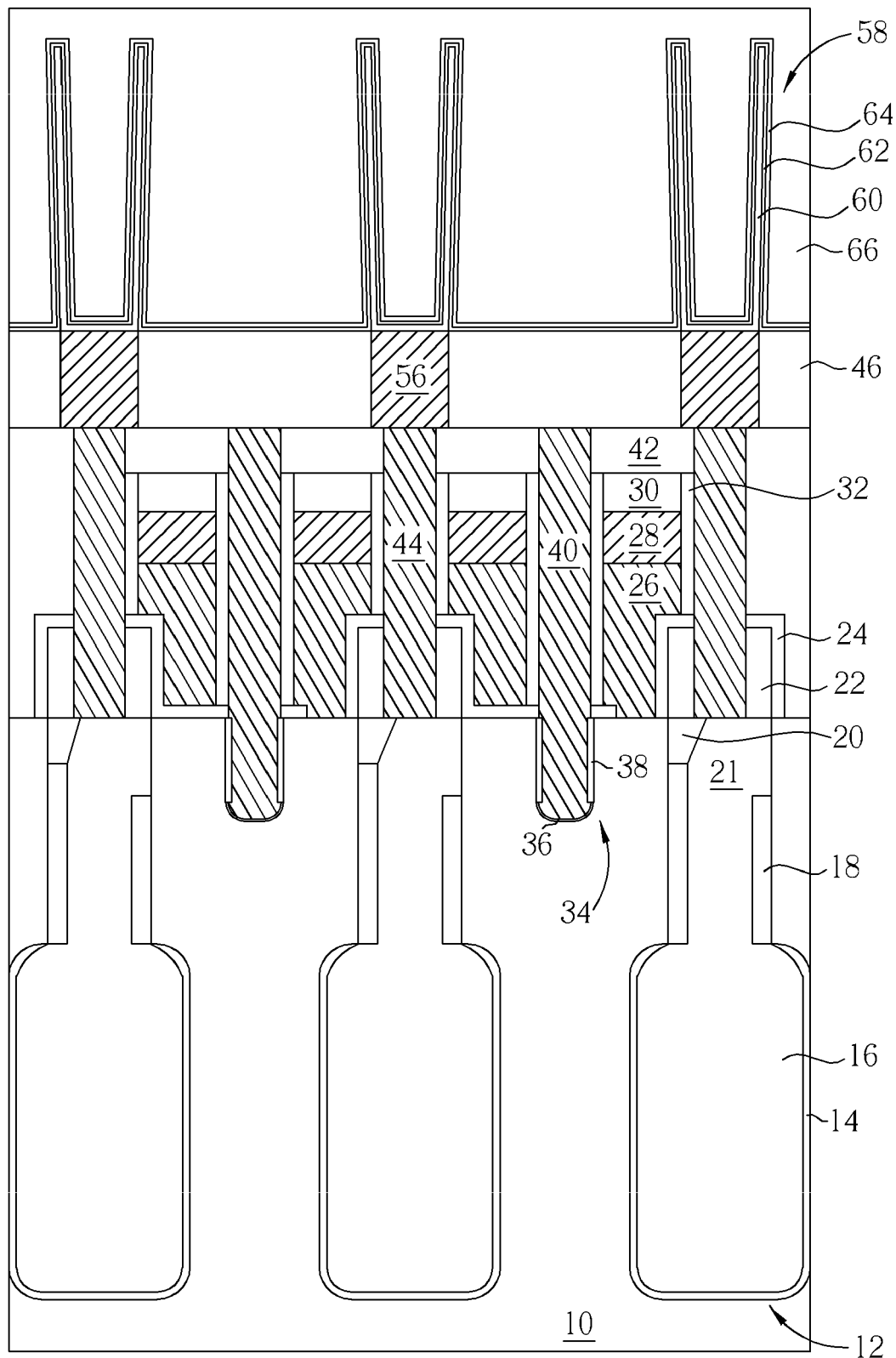
FIGS. 8 and 9 are schematic cross-section views showing another embodiment of the DRAM structure according to the present invention.
Figure 9:
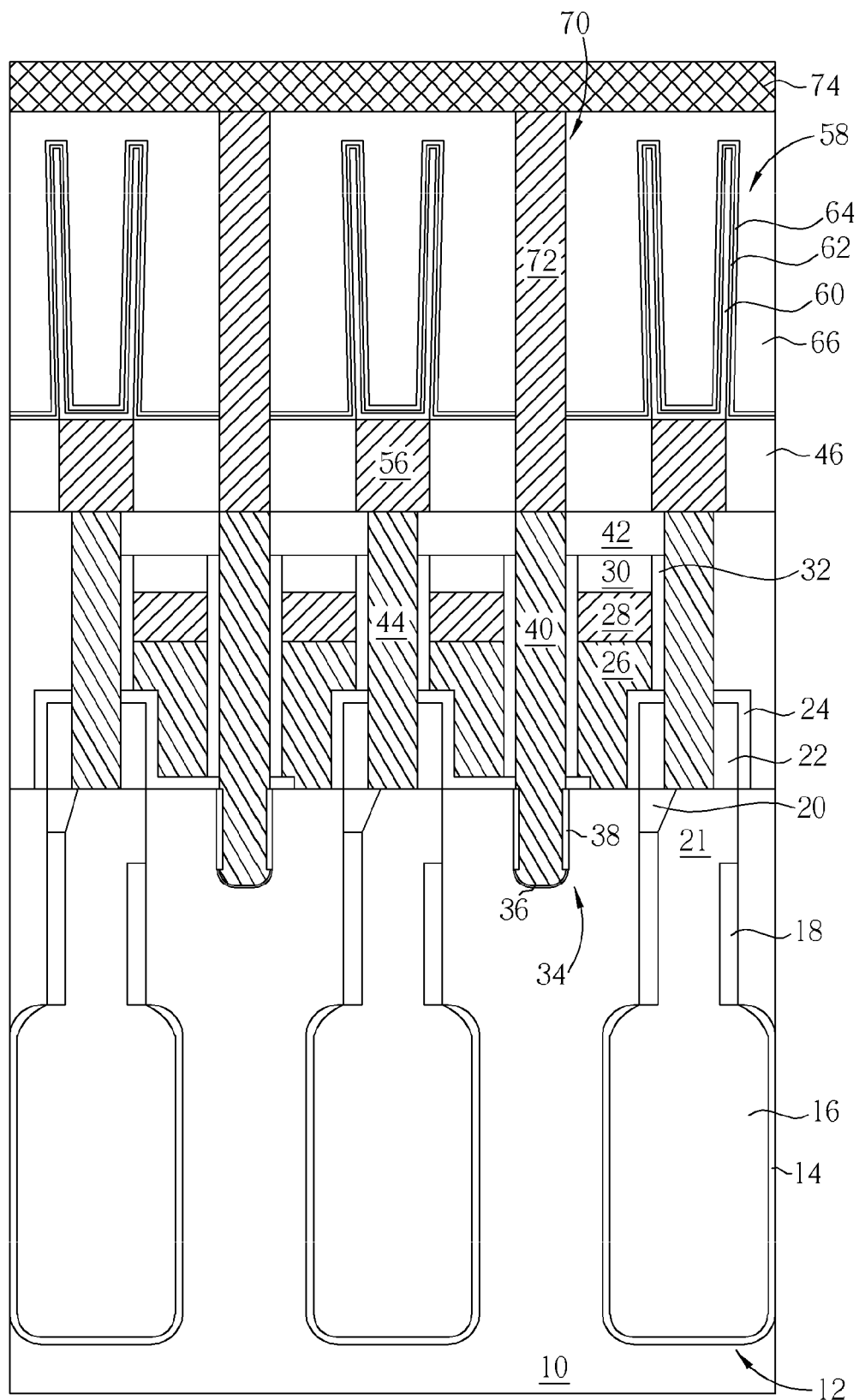

In the above-mentioned embodiment, the stack capacitor structures 58 are higher than the first metal interconnects. In another embodiment according to the present invention, the stack capacitor structures 58 are disposed at positions lower than those of the first metal interconnects. For example, conductive plugs 56 are allowed to be formed on conductive plugs 44 as shown in FIG. 8 right after the conductive plugs 44 and the gate conductor layers 40 are formed as shown in FIG. 3. Thereafter, stack capacitor structures 58 are formed on the conductive plugs 56. Thereafter, referring to FIG. 9, recesses 70 are formed through the interlayer dielectrics 46 and 66 to expose the gate conductor layers 40, and contact plugs 72 are formed to contact the gate conductor layers 40 by filling the recesses 70 with a conductive material. As such, the top of the contact plugs 72 is higher than the stack capacitor structures 58. Accordingly, the first metal interconnects 74 may be directly formed on the stack capacitor structures 58, and the first metal interconnects 74 and the gate conductor layers 40 may be allowed to substantially perpendicularly intersect and electrically connect to each other through contact plugs 72.

The dielectric layers or interlayer dielectrics formed in the DRAM structure according to the present invention may include silicon oxide, such as TEOS oxide. The conductive plugs, contact plugs, or plugs formed may include conductive material, for example, polysilicon, metal, such as tungsten, and the like. The metal interconnects or the landing pads formed may include for example metal, such as, tungsten. When tungsten is employed, a barrier layer may be further formed between the tungsten and the interlayer dielectric to prevent from diffusion of the metal into the interlayer dielectric.

Figure 10:
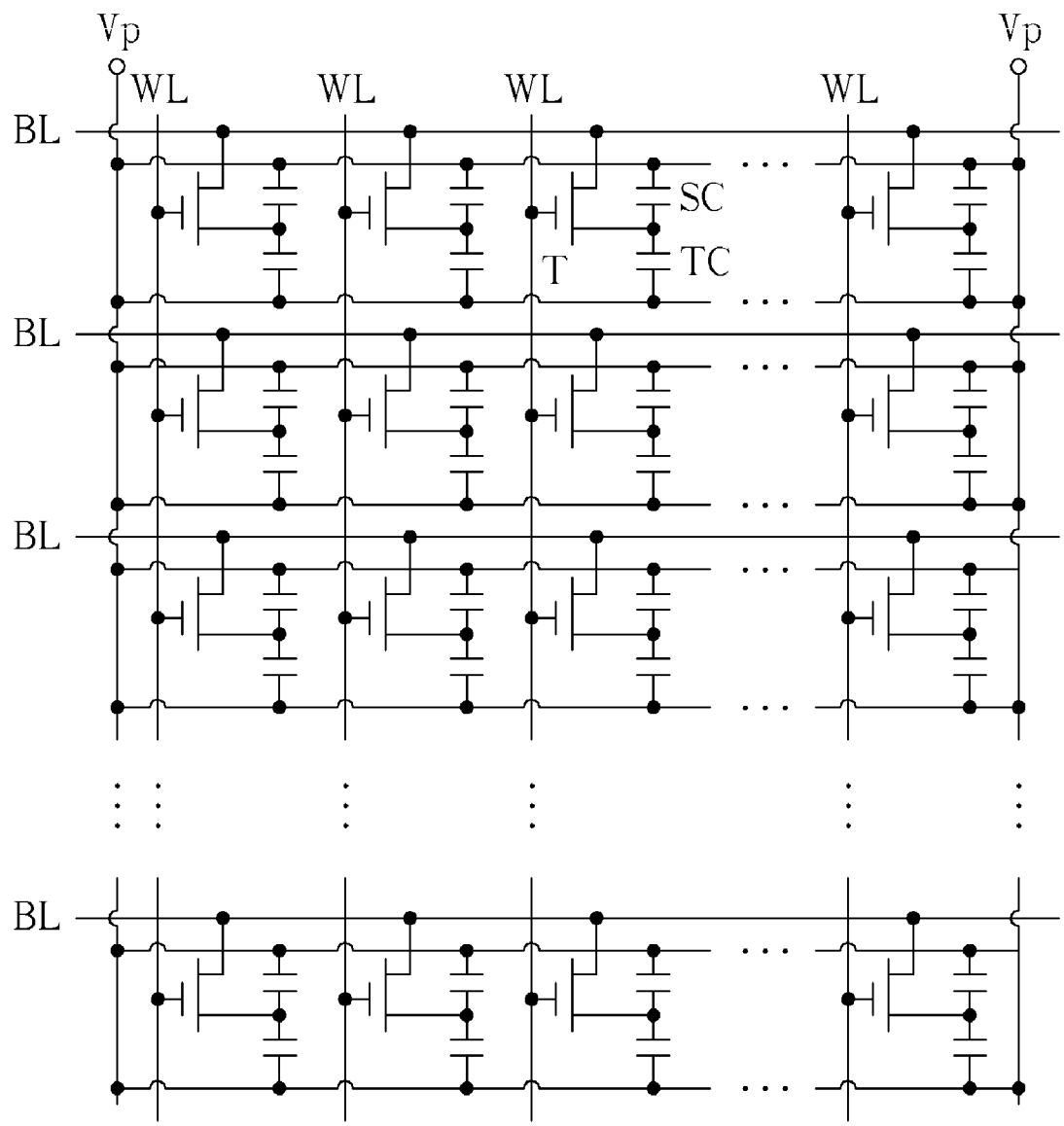
FIG. 10 shows a schematic electrical circuit diagram of an array of the DRAM structures according to the present invention.

FIG. 10 shows a schematic electrical circuit diagram of an array of the DRAM structures according to the present invention, to easily understand the usage of the present invention. The word line WL connects the gate of the transistor T, and the bit line BL connects the source of the transistor T. The trench capacitor structure TC and the stack capacitor structure SC are merged through the conductive structure according to the present invention that the trench capacitor structure TC is electrically connected to the drain of the transistor T through the SSBS, and the other electrode of the trench capacitor structure TC and the other electrode of the stack capacitor structure SC are electrically connected to each other at the periphery of the array area through conductive wires, and have a common electrode voltage $V_p$.

Those skilled in the art will readily observe that numerous modifications and alterations of the device and method may be made while retaining the teachings of the invention.

What is claimed is:

1. A dynamic random access memory (DRAM) structure, comprising:
   a substrate;
   a recessed-gate transistor disposed in the substrate;
   a word line disposed on and electrically connected to the recessed-gate transistor;
   a trench capacitor structure disposed in the substrate and electrically connected to the recessed-gate transistor;
   a first conductive structure disposed on and in direct contact with an electrode of the trench capacitor structure, wherein the first conductive structure has a central axis that is coaxial with a central axis of the trench capacitor structure;
   a stack capacitor structure disposed on and contacting the first conductive structure, wherein a bottom electrode of the trench capacitor structure and a top electrode of the stack capacitor structure are electrically connected to each other to serve as a common electrode; and
   a bit line disposed above and electrically connected to the recessed-gate transistor, wherein a top of the bit line is lower than a top of the word line.

2. The DRAM structure of claim 1, wherein the first conductive structure comprises:
   a conductive plug disposed on and contacting the trench capacitor structure; and
   a contact node disposed on and contacting the conductive plug.

3. The DRAM structure of claim 2, wherein, the conductive plug comprises polysilicon or metal, and the contact node comprises tungsten.

4. The DRAM structure of claim 1 further comprising a first metal interconnect intersecting the word line and the first metal interconnect being connected to the word line through a second conductive structure.

5. The DRAM structure of claim 4, wherein the second conductive structure comprises a landing pad disposed on the word line and extending in a direction substantially parallel to the bit line, to provide a space for connecting to the first metal interconnect.

6. The DRAM structure of claim 5, wherein the landing pad is located higher than the bit line and lower than the stack capacitor structure, thereby allowing a position of the first metal interconnect located on the landing pad to be higher than that of the bit line and lower than that of the stack capacitor structure, and the first metal interconnect and the first conductive structure are located on substantially different cross sections of the DRAM structure taken along a longitudinal direction of the first metal interconnect.

7. The DRAM structure of claim 4, wherein the second conductive structure comprises:
   a conductive plug disposed on the word line, wherein a lower end of the conductive plug contacts the word line and an upper end of the conductive plug is higher than the stack capacitor structure, thereby the first metal interconnect being connected to the word line through the second conductive structure crosses over the stack capacitor structure.

8. The DRAM structure of claim 1, the recessed-gate transistor comprises a gate, and the word line is formed in integrity with the gate.

9. The DRAM structure of claim 1, wherein the first conductive structure penetrates through an insulation situated directly above the trench capacitor structure.

* * * * *